US008405281B2

(12) United States Patent
Kim et al.

(10) Patent No.: US 8,405,281 B2
(45) Date of Patent: Mar. 26, 2013

(54) TRANSDUCER FOR ULTRASONIC DIAGNOSIS DEVICE AND METHOD FOR MANUFACTURING THE SAME

(75) Inventors: Jin-Ki Kim, Seoul (KR); Jeong-chol Seo, Seoul (KR)

(73) Assignee: Medison Co., Ltd., Kangwon-Do (KR)

( * ) Notice: Subject to any disclaimer, the term of this patent is extended or adjusted under 35 U.S.C. 154(b) by 169 days.

(21) Appl. No.: 12/717,737

(22) Filed: Mar. 4, 2010

(65) Prior Publication Data

US 2010/0324425 A1 Dec. 23, 2010

(30) Foreign Application Priority Data

Jun. 23, 2009 (KR) ........................ 10-2009-0056073

(51) Int. Cl.
*H01L 41/08* (2006.01)

(52) U.S. Cl. ........................................................ 310/334

(58) Field of Classification Search ........... 310/334–336
See application file for complete search history.

(56) References Cited

U.S. PATENT DOCUMENTS 5,329,498 A * 7/1994 Greenstein .................... 367/155
5,744,898 A * 4/1998 Smith et al. .................... 310/334
6,043,590 A * 3/2000 Gilmore ......................... 310/367
6,104,126 A * 8/2000 Gilmore ......................... 310/334
7,795,784 B2 * 9/2010 Davidsen et al. ............. 310/334
7,834,522 B2 * 11/2010 Guo .............................. 310/335

FOREIGN PATENT DOCUMENTS

JP 10-229597 8/1998
JP 10-262968 10/1998
JP 2002-165793 6/2002
JP 2005-253029 9/2005

OTHER PUBLICATIONS

Korean Office Action issued in Korean Patent Application No. 10-2009-0056073, mailed Nov. 11, 2010.
Korean Office Action, w/ English translation thereof, issued in Korean Patent Application No. KR 10-2009-0056073 dated Jul. 26, 2011.

* cited by examiner

*Primary Examiner* — Mark Budd
(74) *Attorney, Agent, or Firm* — McDermott Will & Emery LLP

(57) ABSTRACT

Disclosed is a transducer of an ultrasonic diagnosis device. Electrode patterns are formed inside a backing block, as one body, and thus, a prior art FPCB may be omitted.

9 Claims, 11 Drawing Sheets

TRANSDUCER FOR ULTRASONIC DIAGNOSIS DEVICE AND METHOD FOR MANUFACTURING THE SAME

CROSS-REFERENCE TO RELATED APPLICATION

This application claims the benefit of Korean Patent Application No. 10-2009-0056073, filed on Jun. 23, 2009, in the Korean Intellectual Property Office, the disclosure of which is incorporated herein by reference.

BACKGROUND

1. Field

The present invention relates to a transducer of an ultrasonic diagnosis device and a manufacturing method of the transducer, and more particularly, to a transducer of an ultrasonic diagnosis device and a manufacturing method thereof that has a simple configuration, is easy to be manufactured, and prevents a loss and a distortion of an ultrasonic signal.

2. Description of the Related Art

In general, an ultrasonic diagnosis device shoots a sound wave (2 MHZ to 20 MHz) that is not heard by a human, namely, an ultrasonic signal, to a target object to generate an image of an internal tissue of the target object based on a reflected ultrasonic signal from the target object. The ultrasonic has different reflection rates at a boundary between two different materials, and thus, the image of the internal tissue is generated.

In the ultrasonic diagnosis device, a probe may transmit an ultrasonic signal inside the target object, and may receive a returned response signal reflected from each tissue inside the target object. Next, the ultrasonic diagnosis device may make an image of the internal tissue with respect to a detected portion of the target object by reconstructing the response signals received by the probe. The image may be outputted through a monitor of the ultrasonic diagnosis device and the internal tissue of the target object is seen with the naked eyes through the image of the monitor. Accordingly, the ultrasonic diagnosis device is commonly used for accurately diagnosing a disease of a patient in medical fields.

Also, a transducer is included in the probe. The transducer may transfer an ultrasonic signal to the target object and may sense an ultrasonic signal reflected from the target object. FIGS. 1 through 3 illustrate various examples of transducers according to the prior art.

Referring to FIG. 1, according to an example of transducer 10 of the prior art, piezoelectric elements 14 are arranged on a front face of a backing block 12, and matching layers 16 connected to a target object are arranged on front faces of the piezoelectric elements 14, respectively. Also, terminals 18*a* of a flexible PCB (FPCB) 18 are respectively connected to the piezoelectric elements 14 by soldering. However, according to the example of the transducer 10, the terminals 18*a* and the piezoelectric elements 14 are soldered and connected at very small intervals by using separate signal lines 19, and thus, an efficiency and a productivity of manufacturing is reduced due to a low efficiency caused by the soldering.

Referring to FIG. 2, according to an example of a transducer 20 of the prior art, a backing block 22, piezoelectric elements 24, and matching layers 26 are arranged in the same manner as the transducer 10 of FIG. 1. Also, a FPCB 28 is provided between the piezoelectric elements 24 and the backing blocks 22 to respectively connect terminals 28*a* of the FPCB 28 to the piezoelectric elements 24. However, according to the example of the transducer 20, the FPCB 28 is provided on an acoustic path, and thus, an acoustic impedance matching between the piezoelectric elements 24 and the target object is broken and negative effects are intensified in acoustic side. In addition, the FPCB 28 has a configuration of being adhered by using a bond, and thus, it is very difficult to constantly maintain a difference (D) in a height between the piezoelectric elements 24 and the backing block 22. Because, it is difficult to make a thickness of a bonding of the FPCB 28 to be constant.

Referring to FIG. 3, according to another example of a transducer 30 of the prior art, a backing block 32, piezoelectric elements 34, and a matching layer 36 are arranged in the same manner as the transducer 10 of FIG. 1. Also, a FPCB 38 is provided to be vertically inserted into the backing block 32, so that terminals 38*a* of the FPCB 38 are connected to the piezoelectric elements 34, respectively. However, according to the example of the transducer 30, the FPCB 38 is vertically inserted into the backing block 32, and a process of inserting the FPCB 38 into the backing block 32 is very complex and difficult. In addition, since the FPCB 38 is provided inside the backing block 32, it may affect to an acoustic reflection and a sound absorption.

As described in the above description, the prior art transducers 10, 20, and 30 have various problems according to methods of connecting terminals 18*a*, 28*a*, and 38*a*. Accordingly, there is need of a transducer to solve the problems.

SUMMARY

An aspect of the present invention provides a transducer of an ultrasonic diagnosis device and a manufacturing method thereof that connects terminals to piezoelectric elements without an acoustic loss and distortion.

Another aspect of the present invention provides a transducer of an ultrasonic diagnosis device and a manufacturing method thereof that has a simple configuration and is easily manufactured.

Another aspect of the present invention provides a transducer of an ultrasonic diagnosis device and a manufacturing method thereof that forms, inside a backing block, electrode patterns performing as a terminal, thereby omitting FPCB.

Another aspect of the present invention provides a transducer of an ultrasonic diagnosis device and a manufacturing method thereof that eliminates a complex process when the transducer is manufactured, thereby increasing a productivity of manufacturing.

According to an example embodiment, there may be provided a transducer of an ultrasonic diagnosis device including a plurality of piezoelectric elements to transmit/receive an ultrasonic signal to/from a target object, and a backing block having the piezoelectric elements arranged on a front face, and electrode patterns made of conductive material and connected to the piezoelectric elements, are formed inside the backing block.

The electrode patterns that connect with the piezoelectric elements are directly formed inside the backing block, and thus, the transducer of the ultrasonic diagnosis device according to example embodiments may omit an FPCB, unlike a prior art transducer. Accordingly, the ultrasonic diagnosis device may prevent an acoustic loss caused by the FPCB and may omit a complex process of installing the FPCB.

The electrode patterns are formed to be extended and to be in at least one of a shape of a band and a shape of a rod.

The transducer may further include a controller to control operations of the piezoelectric elements. Also, one end of the electrode patterns forms first connecting parts that are arranged on the front face of the backing block and connected to the piezoelectric elements, and the other end of the electrode patterns forms second connecting parts that are arranged on faces other than the front face of the backing block and connected to the controller. Accordingly, the electrode patterns may transfer a control signal of the controller to the piezoelectric elements, and may transfer an ultrasonic signal received by the piezoelectric elements to the controller.

The first connecting parts are arranged to form at least one line on the front face of the backing block. In this instance, the first connecting parts are arranged at intervals spaced apart from each other, the interval preventing interference among the piezoelectric elements.

According to another example embodiment, there may be provided a method of manufacturing a transducer, the method including forming a first backing block including at least one first combining part, forming at least one second backing block including a second combining part that is combined to the at least one first combining part, forming a plurality of electrode patterns made of conductive material at regular intervals on the at least one first combining part or the at least one second combining part, completing a backing block by combining the at least one first combining part and the at least one second combining part, arranging piezoelectric elements on a front face of the backing block, and connecting the piezoelectric elements to first connecting parts of the electrode patterns formed on the front face of the backing block, respectively, and connecting a controller to each of second connecting parts of the electrode patterns formed on faces other than the front face of the backing block.

The forming of the electrode patterns includes coating at least one first combining part or at least one second combining part with the conductivity material, and eliminating, by using a chemical etching or a dicing machine, a portion of the conductivity material coating to form the electrode patterns.

As another example, the forming of the electrode patterns includes disposing a mask, having holes formed in the same shape of the electrode patterns, to the at least one first combining part or to the at least one second combining part, and coating a portion exposed through the holes of the mask with conductive material to form the electrode patterns.

Cutting of the backing block according to a number of the electrode patterns may be further included between the completing of the backing block and the connecting of the piezoelectric elements. Accordingly, the backing block are formed to have as many electrode patterns as possible, and the backing block is cut in a size appropriate for a circumstance and a designing condition of the transducer during the cutting of the backing block.

Adhering a plurality of backing blocks to each other, the plurality of backing blocks being completed from the completing of the backing block may be further included between the completing of the backing block and the connecting of the piezoelectric elements. That is, when the backing blocks having electrode patterns formed in a line are adhered to each other to be a laminated structure, a backing block having electrode patterns formed in a plurality of lines may be simply formed.

Additional aspects and/or advantages will be set forth in part in the description which follows and, in part, will be apparent from the description, or may be learned by practice of the embodiments.

EFFECT

A transducer of an ultrasonic diagnosis device and a manufacturing method thereof according to example embodiments of the present invention may omit a FPCB that is used for a prior art transducer, since electrode patterns that connects piezoelectric elements and a controller is directly formed inside a backing block, thereby forming the transducer in a simple configuration.

A transducer of an ultrasonic diagnosis device and a manufacturing method thereof according to example embodiments of the present invention may prevent acoustic loss and distortion caused by the FPCB by omitting the FPCB, and may improve an acoustic efficient by eliminating a mass effect of the FPCB. In addition, a complex process of installing the FPCB in a backing block is omitted, and thus, the transducer may be easily manufactured and a productivity of the manufacturing of the transducer may increase.

A transducer of an ultrasonic diagnosis device and a manufacturing method thereof according to example embodiments of the present invention may conveniently form electrode patterns, inside a backing block, in various forms according to a circumstance and a designing condition of the transducer, and thus, the transducer may be easily applicable to various types of probes.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION

Figure 1:
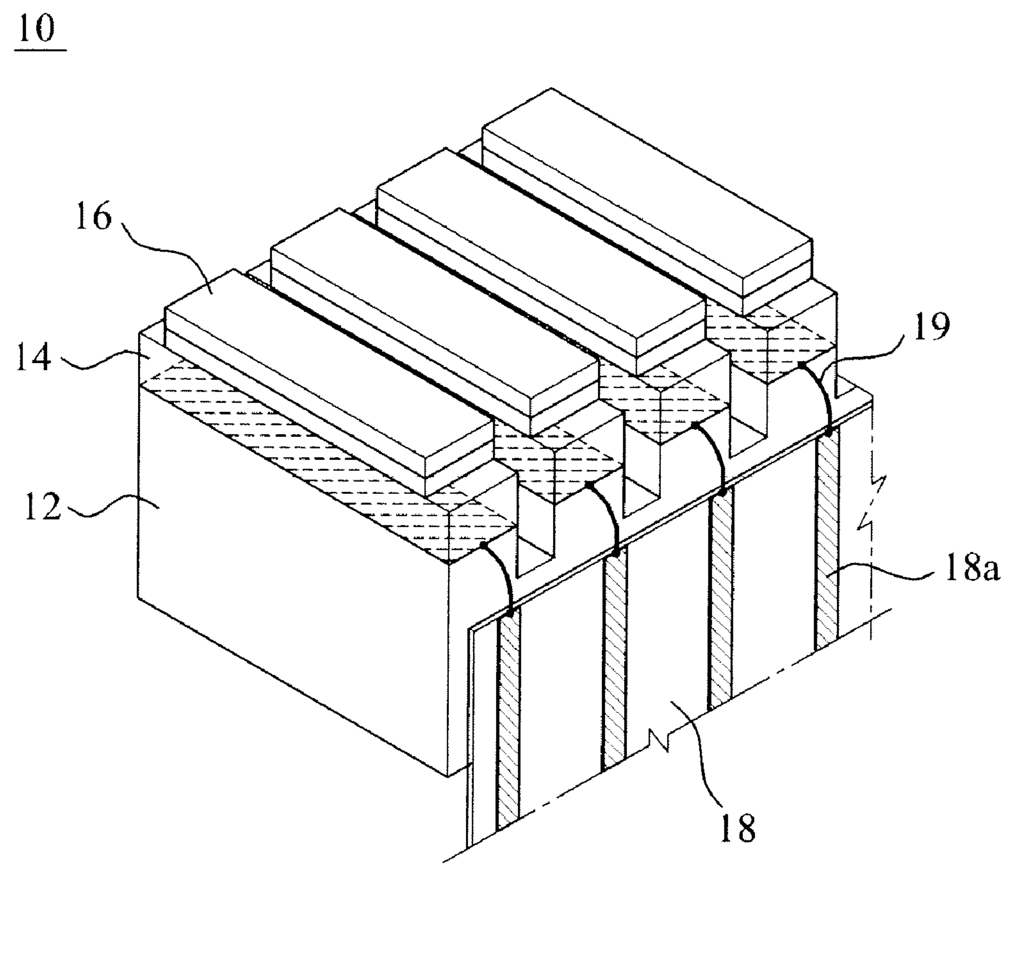
FIG. 1 PRIOR ART
FIG. 1 is a diagram roughly illustrating a main portion of an example of a transducer according to the prior art.
Figure 2:
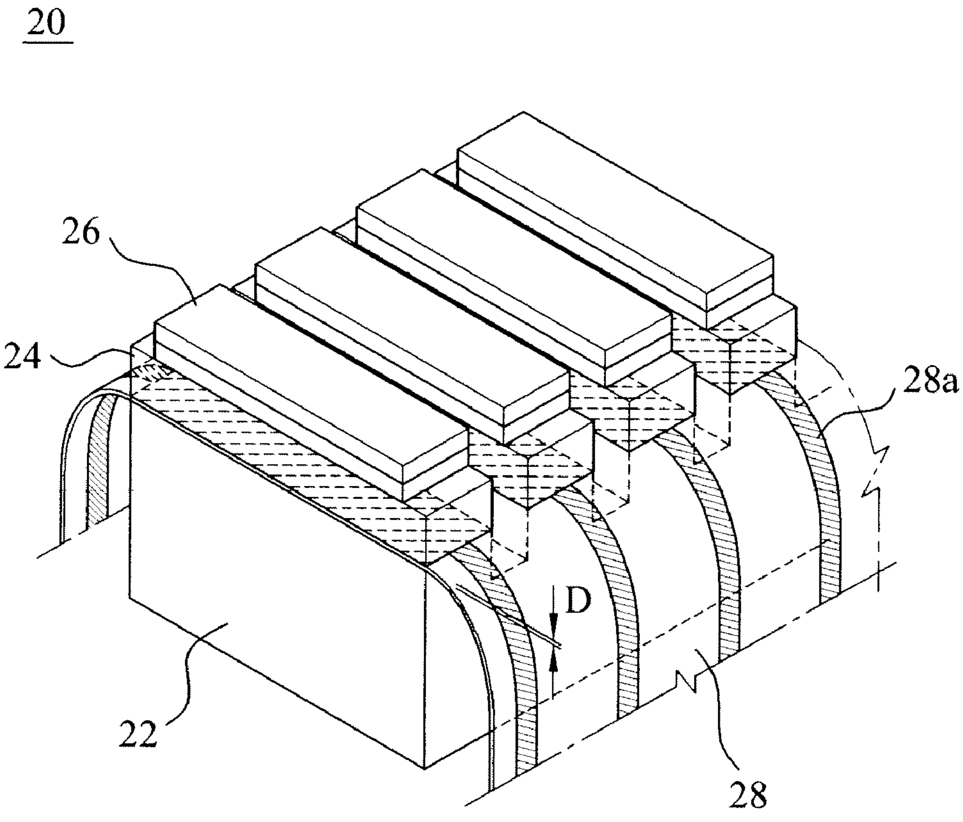
FIG. 2 PRIOR ART
FIG. 2 is a diagram roughly illustrating a main portion of another example of a transducer according to the prior art.
Figure 3:
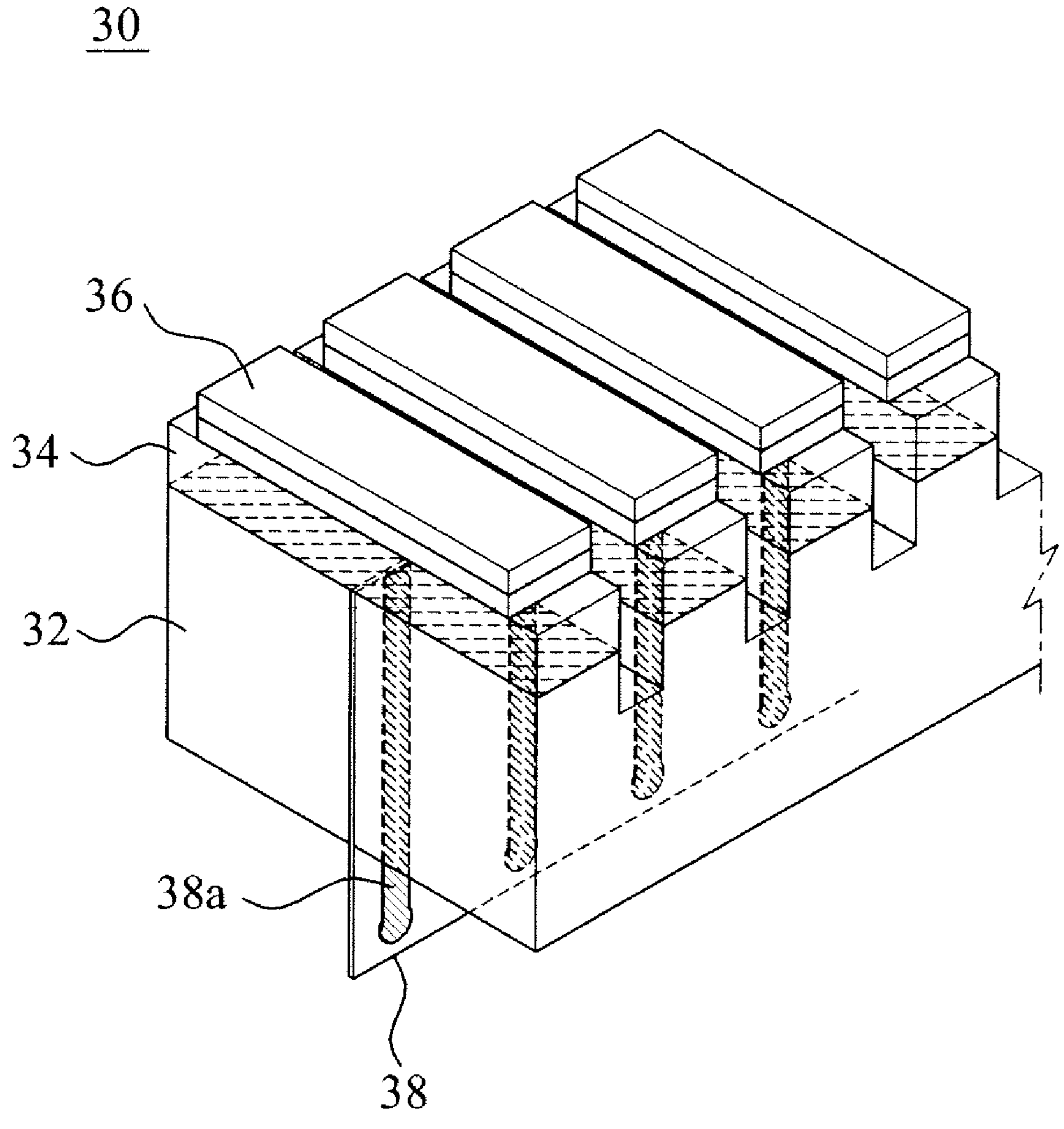
FIG. 3 PRIOR ART
FIG. 3 is a diagram roughly illustrating a main portion of still another example of a transducer according to the prior art.

Reference will now be made in detail to example embodiments, examples of which are illustrated in the accompanying drawings, wherein like reference numerals refer to the like elements throughout. An ultrasonic diagnosis device utilizing a touch interaction is described below to explain the present disclosure by referring to the figures.

Figure 4:
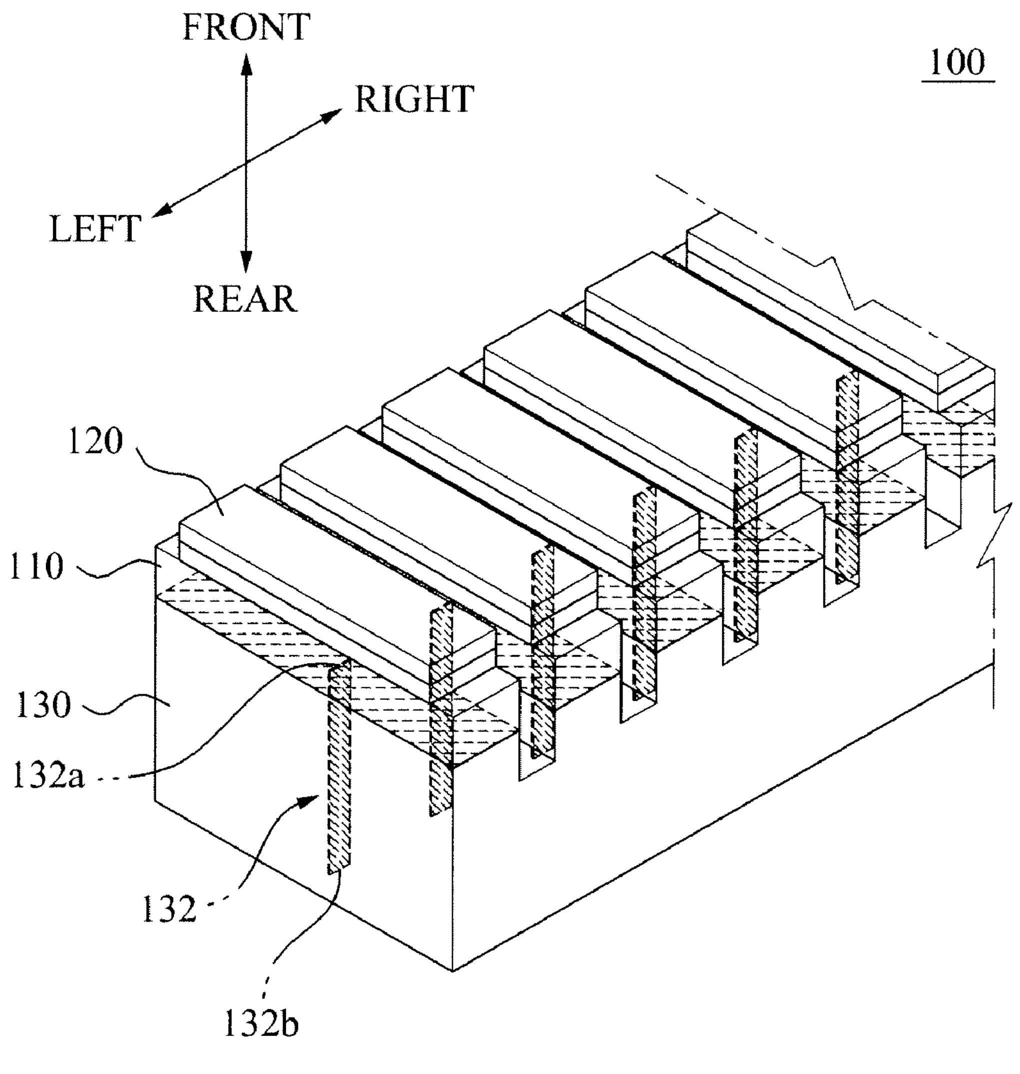
FIG. 4 is a diagram roughly illustrating a main portion of a transducer of an ultrasonic diagnosis device according to an example embodiment of the present invention.
Figure 5:
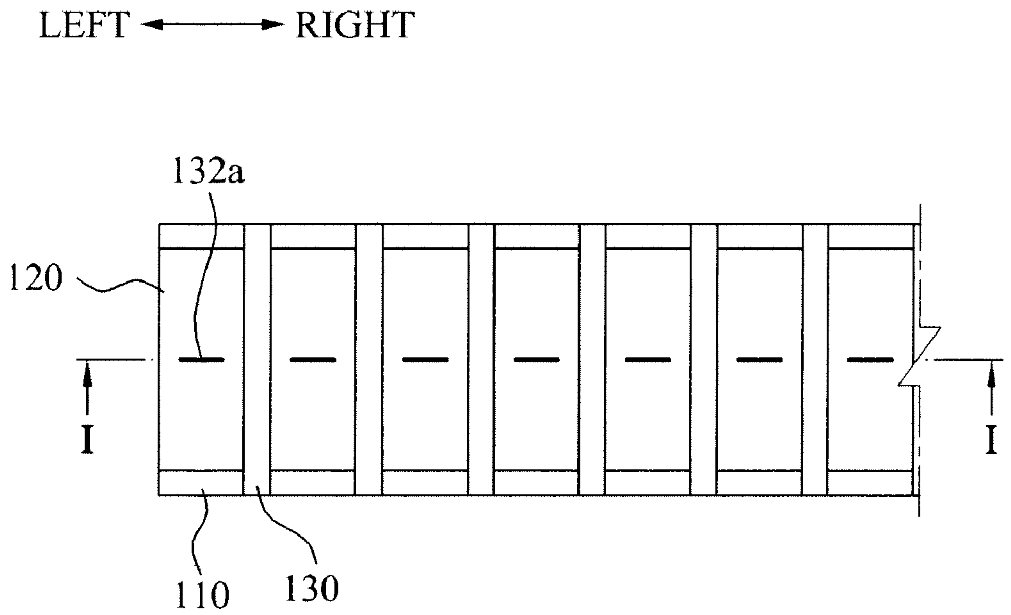
FIG. 5 is a front view of the main portion of the transducer of FIG. 4.
Figure 6:
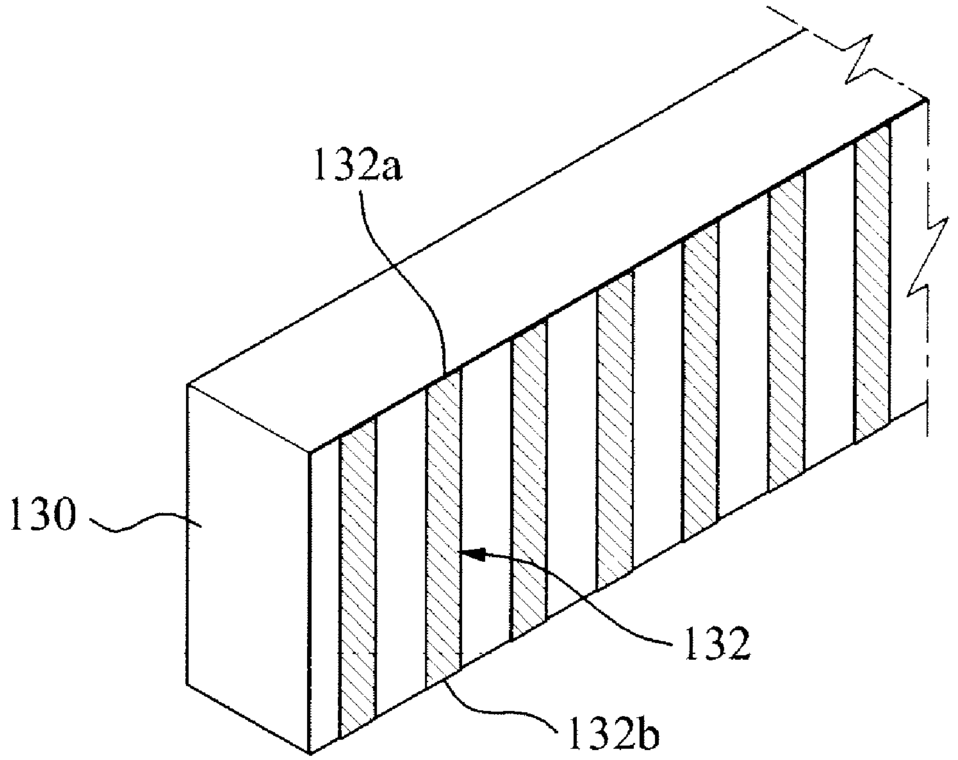
FIG. 6 is a perspective view of a cross-section of a backing block according to the I-I line of FIG. 5.

FIG. 4 is a diagram roughly illustrating main portions of a transducer of an ultrasonic diagnosis device according to an example embodiment of the present invention, FIG. 5 is a front view of the main portions of the transducer of FIG. 4, and FIG. 6 is a perspective view of a cross-section of a backing block according to the I-I line of FIG. 5.

Referring to FIG. 4, a transducer 100 of an ultrasonic diagnosis device includes piezoelectric elements 110, matching layers 120, and a backing block 130.

The piezoelectric elements 110 are elements to transmit an ultrasonic signal to a target object and to receive a returned ultrasonic signal reflected from the target object. The piezoelectric elements 110 may be arranged on a front face of the backing block 130 spaced apart from each other at regular intervals. Hereinafter, although the present example embodiment describes the piezoelectric elements 110 are arranged on the front face of the backing block 130 in a line in a left-and-right direction, example embodiments may not be limited thereto and may be arranged in various shapes.

The matching layers 120 are members arranged on front faces of the piezoelectric elements and connected to the target object. The matching layers 120 perform mediating of ultrasonic signal transferring between the piezoelectric elements and the target object. The matching layers 120 may be arranged on the front faces of the piezoelectric elements, respectively.

Referring to FIGS. 4 through 6, the backing block 130 is a member to support the piezoelectric elements 110. In addition, the backing block 130 may prevent vibration from being transferred among the piezoelectric elements 110. Accordingly, the backing block 130 may be made of damping materials of a low acoustic impedance. The front face of the backing block 130 may be formed in a shape of a plane or a curved surface, depending on a circumstance and a designing condition of the probe.

A plurality of electrode patterns 132 respectively connecting with the piezoelectric elements may be formed inside the backing block 130, as one body. The electrode patterns 132 may be made of conductive material. The electrode patterns 132 may be formed, inside the backing block 130, to be extended and to be in at least one of a shape of a band and a shape of a rod. Hereinafter, the present example embodiment will describe that the electrode patterns 132 are formed in the shape of the band.

One end of the electrode patterns 132 may form first connecting parts **132*a* that are respectively connected to the piezoelectric elements. The one end of the electrode patterns may be arranged on the front face of the backing block 130. Also, the first connecting parts 132*a* may be arranged on the front face of the backing block 130 in a line at intervals spaced apart from each other. In this instance, the interval may be set to have a sufficient distance to prevent interference among the piezoelectric elements 110**.

The other end of the electrode patterns 132 may form second connecting parts **132*b* that are connected to a controller which will be described later. The other end of the electrode patterns 132 may be arranged on a rear face of the backing block 130. Also, in the same manner as the first connecting parts 132*a*, the second connecting parts 132*b* may be arranged on the rear face of the backing block in a line at intervals spaced apart from each other Also, the transducer 100 may further include the controller (not illustrated) to control operations of the piezoelectric elements 110. The controller may be configured by an electric circuit, and may be connected with a microcontroller of the ultrasonic diagnosis device that is connected with the probe. Accordingly, the electrode patterns 132 may transfer a control signal of the controller to the piezoelectric elements 110, and may transfer an ultrasonic signal received by the piezoelectric elements 110 to the controller. Examples of a method of connecting the second connecting parts 132*b* to the controller may include a method of directly disposing a printed circuit board (PCB) to the rear face of the backing block 130**, a method of utilizing an anisotropic conductor, as an example, a connector such as a GB matrix of SHINETSUT, and a method of utilizing an ACF film.

Figure 7:
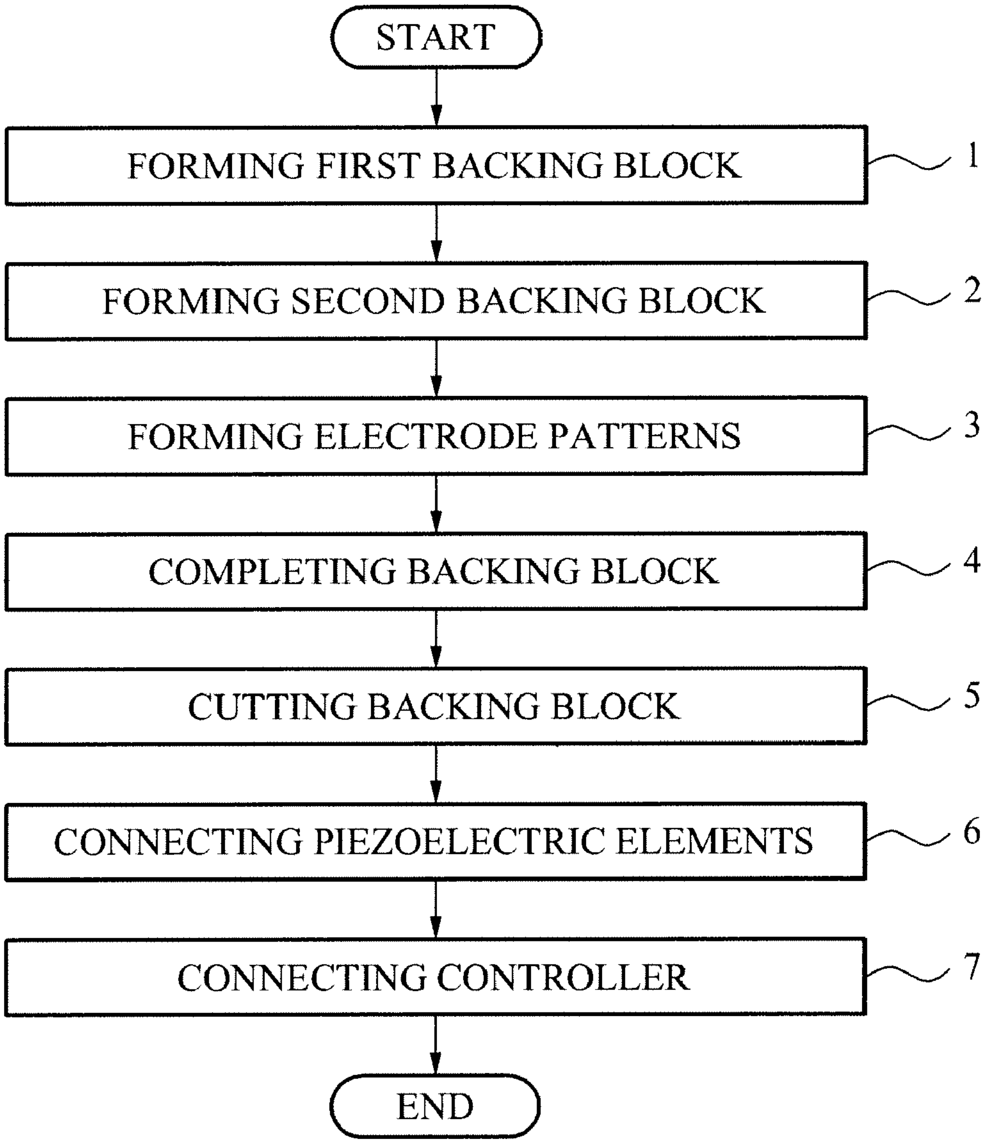
FIG. 7 is a flowchart illustrating a method of manufacturing a transducer of an ultrasonic diagnosis according to an example embodiment of the present invention.
Figure 8:
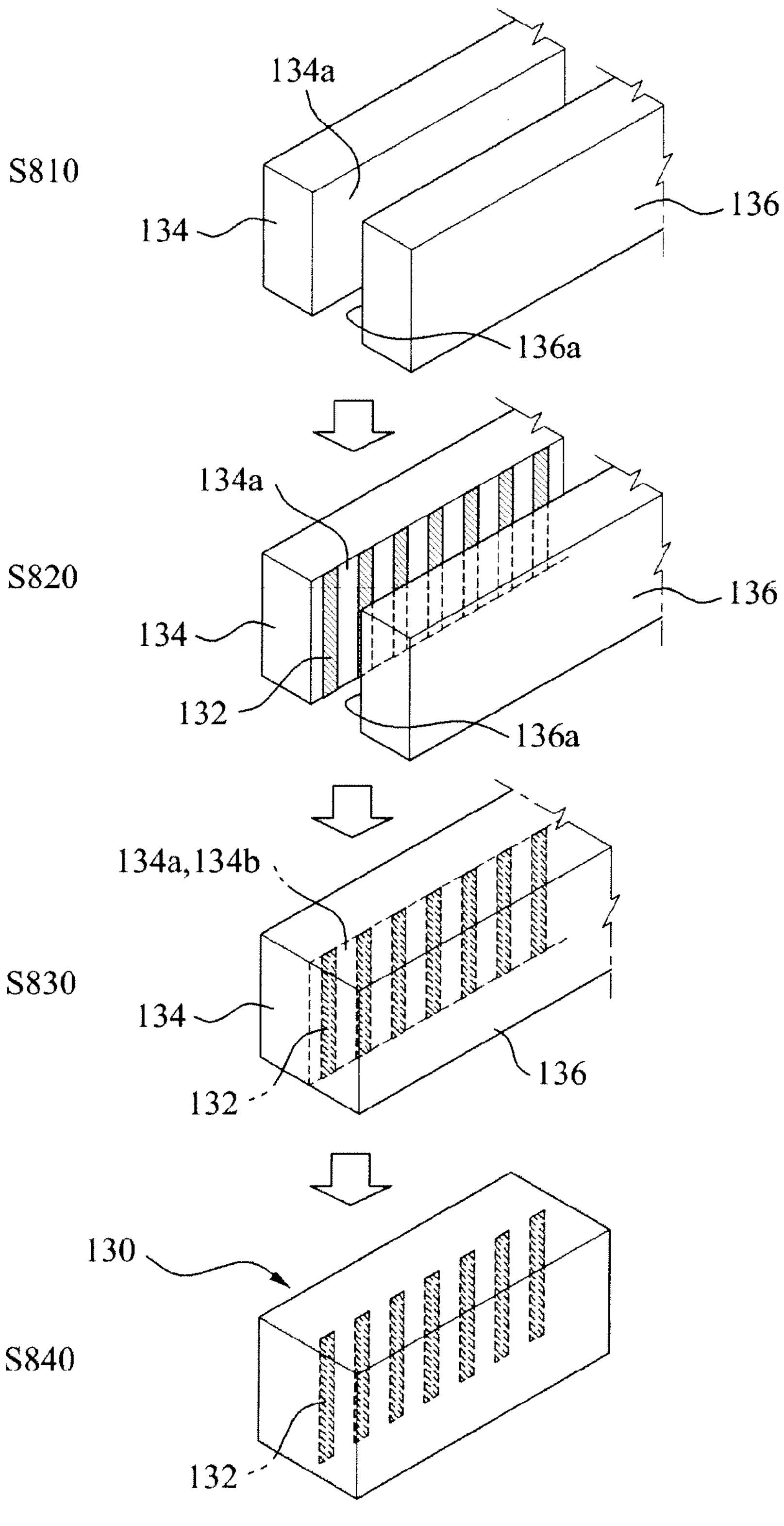
FIG. 8 is a diagram illustrating a process of manufacturing a backing block in the manufacturing method of FIG. 7.

A manufacturing method of the transducer 100 configured as described in the above description will be described. FIG. 7 is a flowchart illustrating a method of manufacturing a transducer of an ultrasonic diagnosis according to an example embodiment of the present invention, and FIG. 8 is a diagram illustrating a process of manufacturing a backing block in the manufacturing method of FIG. 7.

The manufacturing method of the transducer 100 according to an example embodiment of the present invention may include forming a first backing block in operation 1, forming a second backing block in operation 2, forming electrode patterns in operation 3, completing a backing block in operation 4, cutting the backing block in operation 5, connecting piezoelectric elements in operation 6, and connecting the controller in operation 7.

The forming of the first backing block in operation 1 may form the first backing block 134 in an appropriate size. A first combining part **134*a* is formed on one side of the first backing block 134, the first combining part 134*a* being combined with a second combining part 136*a* of a second backing block 136. Hereinafter, although the present example embodiment describes that the first backing block 134 is formed to be extended in a left-and-right direction, it is not limited thereto, and may be formed in various shapes depending on a circumstance and a designing condition of the transducer 100, as illustrated in operation S810 of FIG. 8**.

The forming of the second backing block in operation 2 may form the second backing block 136 in the same or a similar shape of the first backing block 134. The second combining part **136*a* is formed on one side of the second backing block 136, the second combining part 136*a* being combined with the first combining part 134*a*. It is described that the second backing block 136 is formed to be extended in the left-right direction in the same manner as the first backing block 134, as illustrated in operation S810 in FIG. 8**.

The forming of the electrode patterns in operation 3 may form a plurality of electrode patterns 132 made of conductive material on one of the first combining part **134*a* or the second combining part 136*a* spaced apart from each other at regular intervals, as illustrated in operation S820 of FIG. 8**.

The operation of forming the electrode patterns 132 may coat an entire first combining part **134*a* with the conductive material and may eliminate, by using a chemical etching or a dicing machine, a portion of the conductive material coating to form the electrode patterns 132. As another method of forming the electrode patterns 132, unlike the above described method, is disposing a mask, having holes formed in the same shape of electrode patterns 132, to the first combining part 134*a* and coating a portion of the first combining part 134*a* exposed through the holes of the mask with conductive material to form the electrode patterns 132. Also, there are various methods of forming the electrode patterns 132** other than the described method.

The completing of the backing block in operation 4 may complete the backing block 130 by combining a first combining part **134*a* of a first backing block 134 with a second combining part 136*a* of a second backing block 136. Although the first backing block 134 and the second backing block 136 are adhered by using a bond, various methods of adhering without damaging the electrode patterns 132 may be applicable, as illustrated in operation 5830 of FIG. 8**.

The cutting of the backing block in operation 5 may cut the backing block 130 according to a desired number of electrode patterns 132. That is, the backing block 130 may be formed to have as many of the electrode patterns 132 as possible, and the backing block 130 may be cut in an appropriate size according to a circumstance and a designing condition of the transducer 100, as illustrated in operation 5840 of FIG. 8.

Also, the backing block 130 in the appropriate size may be made by forming the first backing block 134 and the second backing block 136 in a desired size and adhering the first backing block 134 to the second backing block 136. However, the method that forms the first backing block 134 and the second backing block 136 to be sufficiently large and cuts the first backing block 134 and the second backing block 136 adhered to each other in an appropriate size to produce a plurality of backing blocks 130 is more efficient in manufacturing.

The connecting of the piezoelectric elements in operation 6 may arrange the piezoelectric elements 110 on a front face of the backing block 130 to connect the piezoelectric elements 110 to first connecting parts 132*a* of the electrode patterns 132 formed on the front face of the backing block 130, respectively.

The connecting of the controller in operation 7 may connect the controller to each of second connecting parts 132*b* of the electrode patterns 132 formed on a rear face of the backing block 130.

Figure 9:
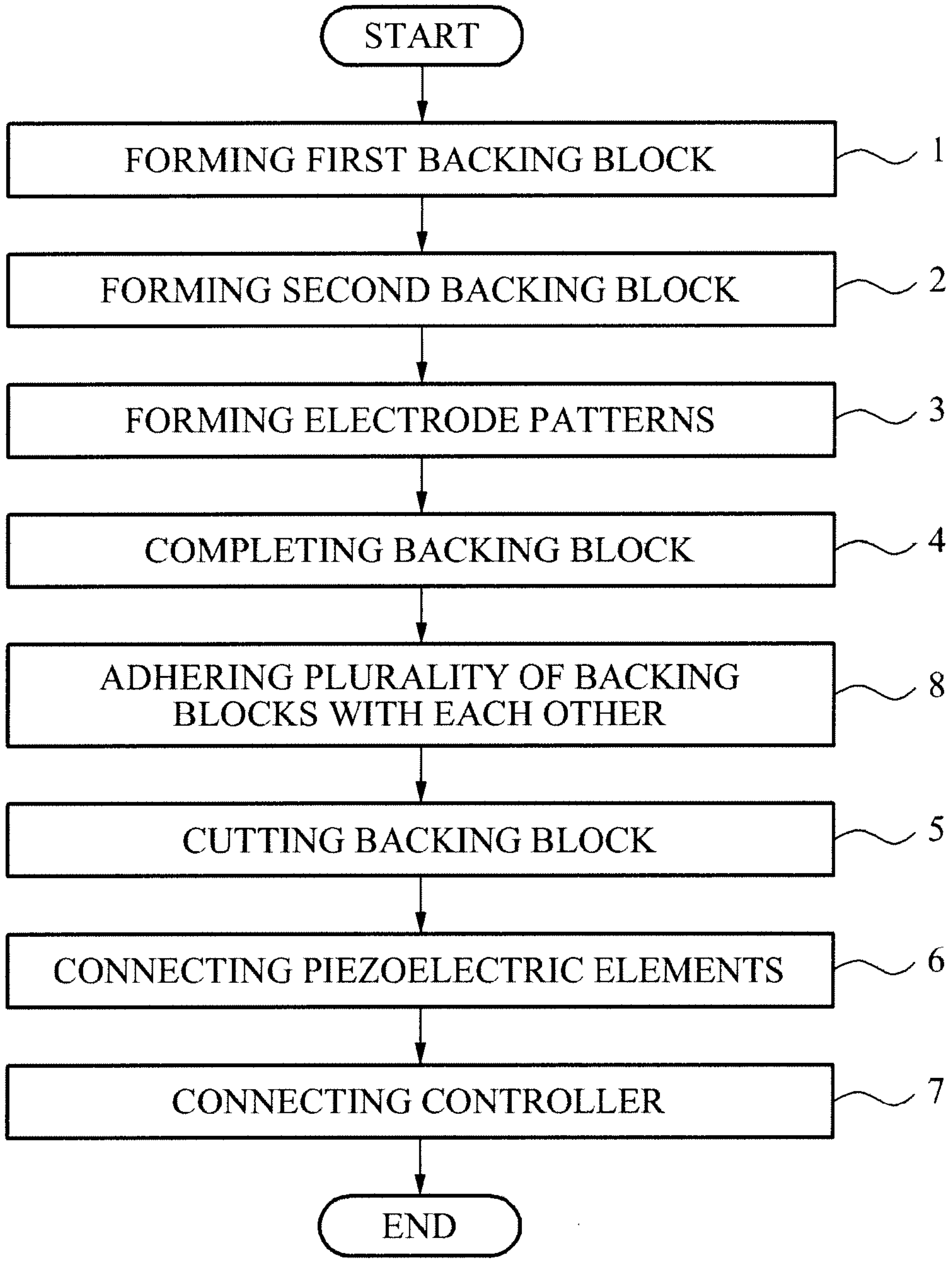
FIG. 9 is a flowchart illustrating a method of manufacturing a transducer of an ultrasonic diagnosis device according to another example embodiment of the present invention.
Figure 10:
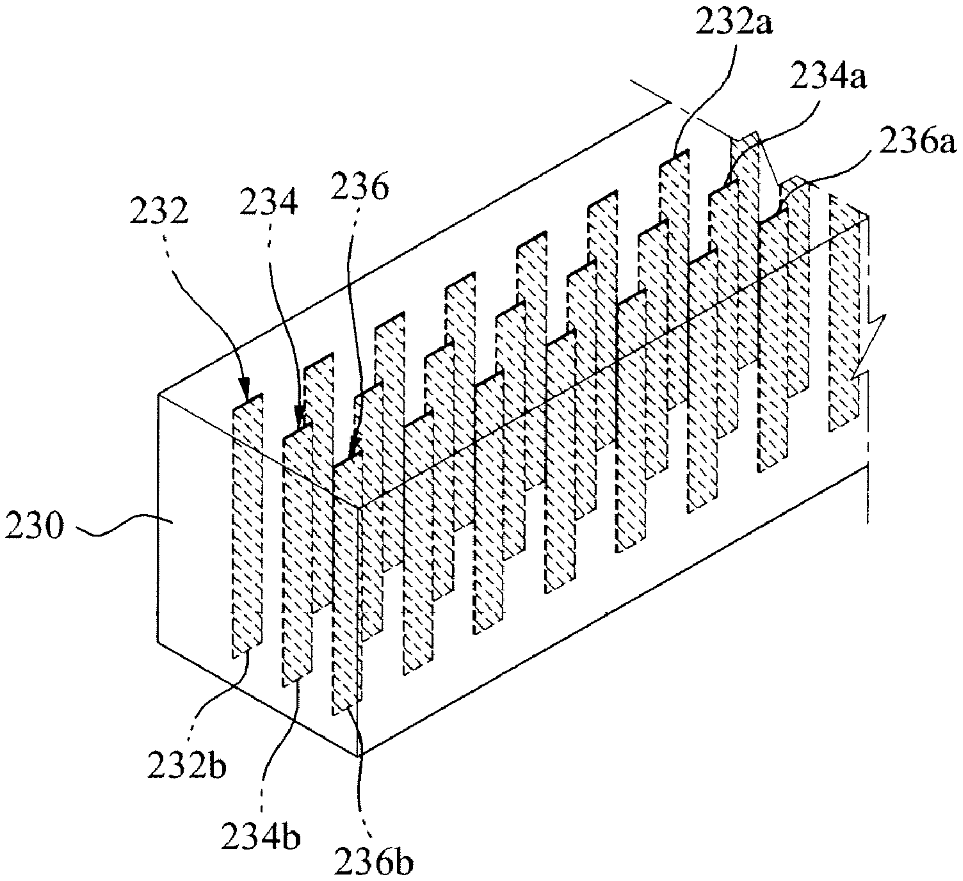
FIG. 10 is a perspective view of a backing block manufactured according to the manufacturing method of FIG. 9.

FIG. 9 is a flowchart illustrating a method of manufacturing a transducer of an ultrasonic diagnosis device according to another example embodiment of the present invention, and FIG. 10 is a perspective view of a backing block manufactured according to the manufacturing method of FIG. 9. In FIGS. 9 and 10, like reference numerals in FIGS. 4 through 8 indicate like elements/operations. Hereinafter, a difference between the transducer of FIGS. 9 and 10 and the transducer 100 of FIGS. 4 through 8 will be described.

Referring to FIGS. 9 and 10, the difference between the transducer of the ultrasonic diagnosis device according to another example embodiment of the present invention and the transducer 100 of FIGS. 4 through 8 is that first connecting parts 232*a*, 234*a*, 236*a* are arranged on a front face of a backing block 230 in a plurality of lines.

That is, each of electrode patterns 232, 234, and 236 may be arranged inside the backing block 230 in a line at predetermined intervals, and the electrode patterns 232, 234, and 236 may be arranged in parallel. Accordingly, first connecting parts 232*a*, 234*a*, and 236*a* are arranged, on a front face of the backing block 230, in a plurality of lines at intervals spaced apart from each other, and second 232*b*, 234*b*, and 236*b* are arranged, on a rear face of the backing block 230, in a plurality of lines at intervals spaced apart from each other.

As described in the description of FIG. 9, the backing block 230 may be manufactured by adhering a plurality of backing blocks 230 to each other, the plurality of backing blocks 230 being completed from the completing of the backing block (4). Accordingly, the method of manufacturing the backing block 230 of FIG. 9 further includes adhering of the plurality of backing blocks to each other in operation 8, when compared with the manufacturing method of FIG. 7.

Figure 11:
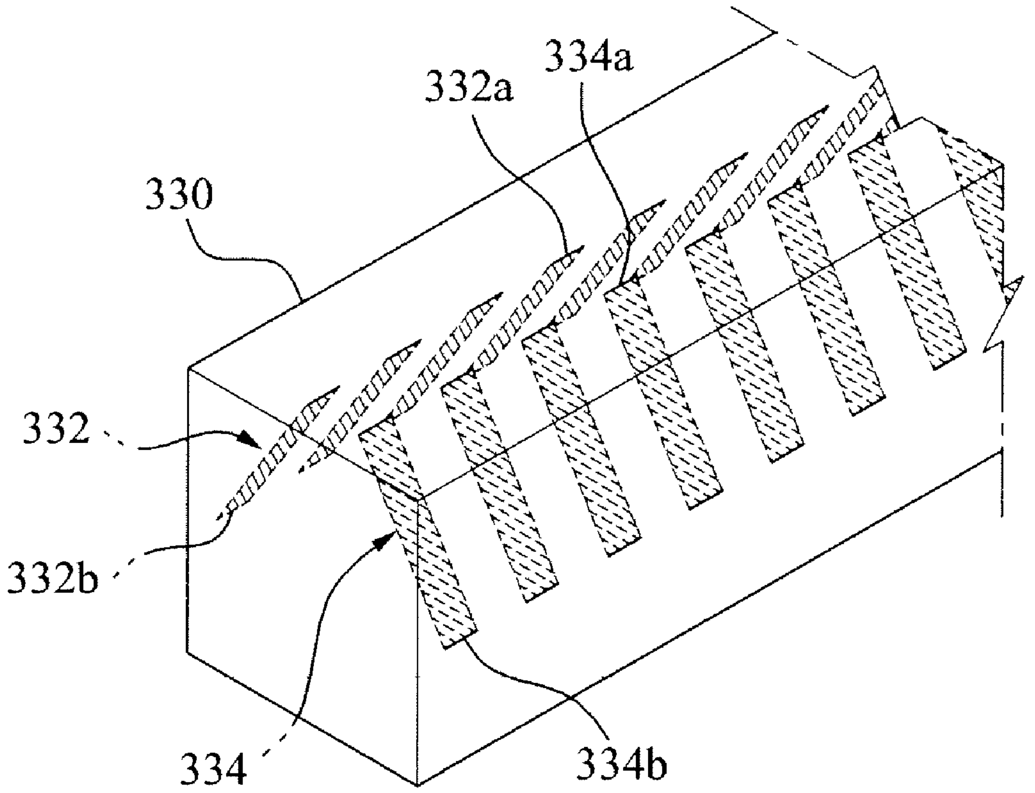
FIG. 11 is a perspective view of a backing block used for a transducer of an ultrasonic diagnosis device according to still another example embodiment of the present invention.

FIG. 11 is a perspective view of a backing block used for a transducer of an ultrasonic diagnosis device according to still another example embodiment of the present invention. In FIG. 11, like reference numerals in FIGS. 4 through 8 indicate like elements/operations. Hereinafter, a difference between the transducer of FIG. 11 and the transducer 100 of FIGS. 4 through 8 will be described.

Referring to FIG. 11, the difference between the transducer of the ultrasonic diagnosis device according to still another example embodiment of the present invention and the transducer 100 of FIGS. 4 through 8 is that electrode patterns 332 and 334 are formed to be inclined inside a backing block 330.

That is, first connecting parts 332*a* and 334*a* of the electrode patterns 332 and 334 are arranged on a front face of the backing block 330, and second connecting parts 332*b* and 334*b* of the electrode patterns 332 and 334 are arranged on a side of the backing block 330. Accordingly, the configuration is appropriate for a probe having a separate structure at a rear of the backing block 330.

The backing block 330 forms at least one first combining part to be inclined in a first backing block and may forms electrode patterns 332 and 334 in the at least one first combining part. Hereinafter, it is described that two first combining parts are formed in the first backing block. Also, two second backing blocks to be combined with the two first combining parts are formed, and the two second backing blocks are combined with the two first combining parts, respectively.

However, three or more first combining parts may be formed in the first backing block and three or more second combining parts to be combined with the first combining parts may be formed. Also, the first combining parts may be formed in different inclination angles, respectively, and the second combining parts may be formed in different inclination angles to be corresponding to the first combining parts.

Accordingly, a transducer of an ultrasonic diagnosis device and a manufacturing method thereof according to example embodiments of the present invention may omit a FPCB that is used for a prior art transducer, since electrode patterns that connect the piezoelectric elements and the controller is formed inside a backing block. Accordingly, the transducer may be formed in a simple configuration and may be easily manufactured.

Also, a transducer of an ultrasonic diagnosis device and a manufacturing method thereof according to example embodiments of the present invention may prevent acoustic loss and distortion caused by a FPCB by omitting the FPCB, and may improve an acoustic efficient by eliminating a mass effect of the FPCB. In addition, a complex process of installing the FPCB in the backing block is omitted, and thus, the transducer may be easily manufactured and a productivity of the manufacturing of the transducer may increase.

Also, a transducer of an ultrasonic diagnosis device and a manufacturing method thereof according to example embodiments of the present invention may conveniently form electrode patterns, inside the backing block, in various shapes according to a circumstance and a designing condition of the transducer, and thus, the transducer may be easily applicable to various types of probe.

Although a few example embodiments have been shown and described, it would be appreciated by those skilled in the art that changes may be made in these example embodiments without departing from the principles and spirit of the invention, the scope of which is defined in the claims and their equivalents.

What is claimed is:

1. A transducer of an ultrasonic diagnosis device, comprising:

a backing block;

a plurality of piezoelectric elements configured to transmit/receive an ultrasonic signal to/from a target object and arranged in a line on a front face of the backing block; and first and second pluralities of electrode patterns made of conductive material, connected to the piezoelectric elements arranged in the line, and formed inside the backing block to be inclined with respect to the front surface of the backing block, wherein one end of each electrode pattern of the first and second pluralities of electrode patterns is arranged on the front face of the backing block and the other end of the electrode patterns is arranged on a face of the backing block other than the front face, wherein the first plurality of electrode patterns is formed inside the backing block such that each electrode pattern of the first plurality is formed on a first plane inclined in one direction with respect to a second plane that is normal to the front surface of the backing block, and wherein the second plurality of electrode patterns is formed inside the backing block such that each electrode pattern of the second plurality is formed on a third plane inclined in the other direction with respect to the second plane that is normal to the front surface of the backing block.

2. The transducer of claim 1, wherein the electrode patterns are formed to be extended and to be in at least one of a shape of a band and a shape of a rod.

3. The transducer of claim 1, further comprising:

a controller to control operations of the piezoelectric elements, wherein one end of each electrode pattern of the first and second pluralities of electrode patterns forms first connecting parts that are arranged on the front face of the backing block and connected to the piezoelectric elements, and the other end of each electrode pattern of the first and second pluralities of electrode patterns forms second connecting parts that are arranged on the face of the backing block other than the front face and are connected to the controller.

4. The transducer of claim 3, wherein the first connecting parts are arranged to form at least one line on the front face of the backing block.

5. The transducer of claim 1, wherein each electrode pattern of the first and second pluralities of electrode patterns is formed inside the backing block to be inclined with respect to the front surface of the backing block so as not to be normal to the front surface of the backing block.

6. The transducer of claim 1, wherein the ends of each electrode pattern of the first plurality of electrode patterns that are arranged on the front face of the backing block are arranged to form at least one line on the front face of the backing block.

7. The transducer of claim 1, wherein the ends of each electrode pattern of the first plurality of electrode patterns that are arranged on the front face of the backing block are arranged to form a first line on the front face of the backing block, and the ends of each electrode pattern of the second plurality of electrode patterns that are arranged on the front face of the backing block are arranged to form a second line on the front face of the backing block that is parallel to and spaced apart from the first line.

8. The transducer of claim 4, wherein the first connecting parts are arranged to form at least two lines on the front face of the backing block.

9. The transducer of claim 1, wherein the backing block is a hexahedron.

* * * * *